United States Patent
Guo (10) Patent No.: US 12,228,523 B2
(45) Date of Patent: Feb. 18, 2025

(54) METHOD OF EVALUATING SiC SUBSTRATE, METHOD OF MANUFACTURING SiC EPITAXIAL WAFER, AND METHOD OF MANUFACTURING SiC DEVICE

(71) Applicant: SHOWA DENKO K.K., Tokyo (JP)

(72) Inventor: Ling Guo, Chichibu (JP)

(73) Assignee: Resonac Corporation, Tokyo (JP)

( * ) Notice: Subject to any disclaimer, the term of this patent is extended or adjusted under 35 U.S.C. 154(b) by 1031 days.

(21) Appl. No.: 17/009,130

(22) Filed: Sep. 1, 2020

(65) Prior Publication Data
US 2021/0063321 A1 Mar. 4, 2021

(30) Foreign Application Priority Data
Sep. 2, 2019 (JP) .................. 2019-159584

(51) Int. Cl.
*G01N 21/95* (2006.01)
*C30B 23/00* (2006.01)
(Continued)

(52) U.S. Cl.
CPC ......... *G01N 21/9505* (2013.01); *C30B 23/00* (2013.01); *C30B 29/36* (2013.01);
(Continued)

(58) Field of Classification Search
CPC .... G01N 21/9505; C30B 23/00; C30B 29/36; H01L 22/20
(Continued)

(56) References Cited

U.S. PATENT DOCUMENTS

| 2011/0031505 A1* | 2/2011 | Harada .............. H01L 21/02516 257/77 |
| 2015/0162187 A1* | 6/2015 | Miyasaka ............... C30B 25/00 257/77 |

(Continued)

FOREIGN PATENT DOCUMENTS

| JP | 2006-286693 A | 10/2006 |
| JP | 2015-521378 A | 7/2015 |

(Continued)

*Primary Examiner* — Dzung Tran
(74) *Attorney, Agent, or Firm* — Sughrue Mion, PLLC (57) ABSTRACT

This method of evaluating a SiC substrate includes a preparation step of preparing two or more SiC substrates obtained from the same SiC ingot grown from the same seed crystal, a defect position specifying step of specifying positions of defects in the substrates by observing a main surface of each of the two or more SiC substrates, and a comparison step of comparing the positions of the defects of the two or more SiC substrates, in which, in the preparation step, a SiC substrate positioned closest to the seed crystal is used as a reference wafer among the two or more SiC substrates, and the comparison step comprises a sub-step wherein a first defect of the reference wafer is compared with a second defect of a SiC substrate other than the reference wafer, it is judged whether a defect distance of the two compared defects in a [11-20] direction is 0.6 mm or more or less than 0.2 mm, and the two compared defects are determined to be defects not associated with the same threading defect when the defect distance is 0.6 mm or more, and the two compared defects are determined to be defects associated with the same threading defect when the defect distance is less than 0.2 mm.

18 Claims, 8 Drawing Sheets

(51) Int. Cl.
  *C30B 29/36* (2006.01)
  *G01N 21/64* (2006.01)
  *H01L 21/66* (2006.01)
  *H01L 21/78* (2006.01)

(52) U.S. Cl.
  CPC ......... *G01N 21/6489* (2013.01); *H01L 22/12* (2013.01); *H01L 21/78* (2013.01); *H01L 22/20* (2013.01)

(58) Field of Classification Search
  USPC .......................................................... 438/14
  See application file for complete search history.

(56) References Cited

U.S. PATENT DOCUMENTS

| | | | | |
|---|---|---|---|---|
| 2015/0361586 | A1* | 12/2015 | Kondo | C30B 23/025 |
| | | | | 117/106 |
| 2016/0215414 | A1* | 7/2016 | Nakabayashi | H01L 29/1608 |
| 2017/0317174 | A1* | 11/2017 | Hiyoshi | H01L 29/1608 |
| 2019/0172758 | A1* | 6/2019 | Nishihara | H01L 22/12 |
| 2019/0177876 | A1* | 6/2019 | Guo | C23C 16/325 |

FOREIGN PATENT DOCUMENTS

| | | |
|---|---|---|
| JP | 2018-131350 A | 8/2018 |
| JP | 2019-40931 A | 3/2019 |
| JP | 2019-192859 A | 10/2019 |
| JP | 2020-31076 A | 2/2020 |
| WO | 2014/043104 A1 | 3/2014 |

* cited by examiner

METHOD OF EVALUATING SiC SUBSTRATE, METHOD OF MANUFACTURING SiC EPITAXIAL WAFER, AND METHOD OF MANUFACTURING SiC DEVICE

BACKGROUND OF THE INVENTION

Field of the Invention

The present invention relates to a method of evaluating a SiC substrate, a method of manufacturing a SiC epitaxial wafer, and a method of manufacturing a SiC device.

Priority is claimed on Japanese Patent Application No. 2019-159584 filed in Japan on Sep. 2, 2019, the content of which is incorporated herein by reference.

Description of Related Art

Silicon carbide (SiC) has characteristic properties. For example, compared to silicon (Si), silicon carbide (SiC) has a dielectric breakdown electric field that is one order of magnitude larger, three times the band gap, and about three times the thermal conductivity. Therefore, silicon carbide (SiC) is expected to be applied to power devices, high-frequency devices, high-temperature operating devices, or the like.

However, SiC devices still have a large number of problems to be solved.

One problem is improving efficiency of a manufacturing process, and another problem is improving a yield. A crystal growth technology of SiC is still in development. Therefore, a large number of crystal defects are present in the manufactured substrates at present. These crystal defects are defects that deteriorate characteristics of SiC devices, that is, device killer defects, and serve as a major factor that hinders the yield.

A metal-oxide-semiconductor field effect transistor (MOSFET) is known as a semiconductor device in which a SiC epitaxial wafer is used. In a MOSFET, a gate oxide film is formed on a SiC epitaxial layer using thermal oxidation or the like, and a gate electrode is formed on the gate oxide film. At this time, when there is a defect in the SiC substrate serving as a base body which is used to form the SiC device, abnormalities may be caused in the SiC device (for example, Patent Document 1, or the like). Therefore, establishment of a high quality SiC epitaxial wafer and a high-quality epitaxial growth technology are absolutely necessary for promoting practical use of the SiC devices using the SiC epitaxial wafers.

On the other hand, various defects are present in a SiC epitaxial wafer. Not all of these defects adversely affect semiconductor devices. That is, there are types of defects having no influence or little influence on the SiC device. Therefore, among various defects, it is required to specify a device killer defect that deteriorates characteristics of the SiC device. A threading defect that is present in a SiC epitaxial wafer is one of the device killer defects. A SiC epitaxial wafer having a threading defect may cause leakage of a liquid during device processing. Also, a withstand voltage failure may be caused even after the device is formed.

The invention described in Patent Document 2 discloses a method of easily inspecting through holes such as micropipes generated in a SiC substrate by applying water or a liquid having a viscosity equivalent to that of water onto a surface side of the SiC substrate, and at the same time, vacuum suctioning around a center of the SIC substrate from a back surface side thereof.

PATENT DOCUMENTS

Patent Document 1: Published Japanese Translation No. 2015-521378 of the PCT International Publication
Patent Document 2: Japanese Unexamined Patent Application, First Publication No. 2006-286693

SUMMARY OF THE INVENTION

The method described in Patent Document 1 can be used to inspect one SiC device at a time. However, when all the generated SiC devices are inspected, it is costly and time-consuming to inspect each of the SiC devices one by one. Therefore, the method described in Patent Document 1 has a poor throughput.

In the method described in Patent Document 2, in order to specify SiC substrates having a device killer defect, a step for separately inspecting SIC substrates is required in addition to the step for manufacturing the SiC devices. In the inspection in the method described in Patent Document 2, it is necessary to apply water or a liquid having a viscosity equivalent to that of water onto a SiC substrate and vacuum-suction the SiC substrate. Therefore, cost and time are required. Therefore, a throughput thereof is poor. Also, in the method described in Patent Document 2, it is not possible to specify positions of through holes included in the SiC substrate to be inspected.

The present invention has been made in view of the above circumstances, and an objective of the present invention is to provide a method of evaluating a SiC substrate in which a threading defect present in a SiC substrate can be efficiently recognized at a low cost.

As a result of intensive research, the present inventors have found a correlation between growth of a SiC ingot and extension of a threading defect.

That is, the present invention provides the following means in order to solve the above-described problems.

(1) A method of evaluating a SiC substrate according to a first aspect of the present invention includes a preparation step of preparing two or more SiC substrates obtained from the same SiC ingot grown from the same seed crystal, a defect position specifying step of specifying positions of defects in the substrates by observing a main surface of each of the two or more SiC substrates, and a comparison step of comparing the positions of the defects of the two or more SiC substrates, in which, in the preparation step, a SiC substrate positioned closest to the seed crystal is used as a reference wafer among the two or more SiC substrates, and the comparison step comprises a sub-step wherein a first defect of the reference wafer is compared with a second defect of a SiC substrate other than the reference wafer, it is judged whether a defect distance of the two compared defects in a [11-20] direction is 0.6 mm or more or less than 0.2 mm, and the two compared defects are determined to be defects not associated with the same threading defect when the defect distance is 0.6 mm or more, and the two compared defects are determined to be defects associated with the same threading defect when the defect distance is less than 0.2 mm.

The method of evaluating a SiC substrate according to the first aspect of the present invention preferably has the following features. It is also preferable to combine two or more of the following features.

(2) In the method of evaluating a SiC substrate according to the above-described aspect, a defect distance between the first defect and the second defect in a [1-100] direction, which are compared in the sub step, may be 0.2 mm or less.

(3) In the method of evaluating a SiC substrate according to the above-described aspect, the comparison step may further comprise a sub-step wherein it is judged whether a defect distance of the first defect and the second defect in a [1-100] direction is 0.2 mm or less, and the first defect and the second defect are determined to be defects associated with the same threading defect when the defect distance of the first defect and the second defect in a [1-100] direction is 0.2 mm or less.

(4) The method of evaluating a SiC substrate according to the above-described aspect may further include a correlation determination step, in which three or more SiC substrates may be prepared from the same SiC ingot in the preparation step, and when the defect distance of the two defects in the [11-20] direction obtained by comparison in the comparison step is 0.2 mm or more and less than 0.6 mm, the correlation determination step may include a sub-step of obtaining a determination coefficient from a position of the first defect, a position of the second defect, a position of a third defect which is present in a SiC substrate different from any of the SiC substrates in which the first defect and the second defect are present and whose defect distances from itself to the first defect and the second defect in the [11-20] direction are each less than 0.6 mm, and a branch number indicating an order of each SiC substrate of the substrates, and a sub-step of determining a correlation of the defects in which the first defect, the second defect, and the third defect are judged to be defects associated with the same threading defect when the determination coefficient is 0.7 or more.

(5) In the method of evaluating a SiC substrate according to the above-described aspect, the determination coefficient may be 0.5 or more.

(6) The method of evaluating a SIC substrate according to the above-described aspects may further include an identification step of identifying that the defect that has been judged to be associated with the same threading defect in the comparison step is also present at the same position of all the SiC substrates formed from the same SiC ingot.

(7) In the method of evaluating a SiC substrate according to the above-described aspects, the reference wafer may be a SiC substrate taken out from a range within ¼ of the thickness of the SiC ingot from a surface of the SiC ingot.

(8) In the method of evaluating a SiC substrate according to the above-described aspects, a position of a threading defect present in a SiC substrate other than the SIC substrates in which the first defect and the second defect are present and obtained from the same SiC ingot may be estimated on the basis of the positions of the defects that have been judged to be a defect associated with the same threading defect in the comparison step.

(9) In the method of evaluating a SiC substrate according to the above-described aspects, the reference wafer may be a SiC substrate positioned closest to the seed crystal among SiC substrates obtained from the same SiC ingot.

(10) A method of manufacturing a SiC epitaxial wafer according to a second aspect of the present invention includes a recognition step of recognizing a position of a threading defect using the method of evaluating a SiC substrate according to the first aspect.

(11) A method of manufacturing a SiC device according to a third aspect of the present invention includes a recognition step of recognizing a position of a threading defect using the method of evaluating a SiC substrate according to the first aspect.

According to the method of evaluating a SiC substrate according to the first aspect of the present invention, it is possible to recognize a threading defect present in a SiC substrate, and estimate positions of threading defects present in a plurality of SiC substrates obtained from the same ingot.

Also, it is possible to provide a method of evaluating a SiC substrate in which a threading defect present in a SiC substrate can be efficiently recognized at a low cost.

DETAILED DESCRIPTION OF THE INVENTION

Hereinafter, preferred examples and embodiments of a method of evaluating a SiC substrate of a first aspect, a method of manufacturing a SIC epitaxial wafer of a second aspect, and a method of manufacturing a SiC device of a third aspect of the present invention will be described in detail with reference to the drawings. In the drawings used in the following description, there are cases in which characteristic portions are appropriately enlarged for convenience of illustration so that characteristics of the present invention can be easily understood, and dimensional proportions of respective constituent elements may be different from actual ones. Materials, dimensions, and the like illustrated in the following description are merely examples, and the present invention is not limited thereto and can be implemented with appropriate modifications within a range not changing the gist of the present invention.

In the present embodiment, crystal orientations and planes are represented using the following symbols as Miller indices. ( ) and { } are used when indicating planes. ( ) are used to indicate a specific plane, and { } are used to indicate a generic name (collective plane) of equivalent planes due to symmetry of a crystal. On the other hand, < > and [ ] are used to indicate directions. [ ] are used to indicate a specific direction, and < > are used to indicate an equivalent direction due to symmetry of a crystal.

In the present specification, a SiC epitaxial wafer is a wafer after a SiC epitaxial layer is formed, and a SiC substrate is a wafer before a SiC epitaxial layer is formed. Also, "threading defect" used in the present specification includes a micropipe having a large size.

<Method of Evaluating a SiC Substrate>

Figure 1:
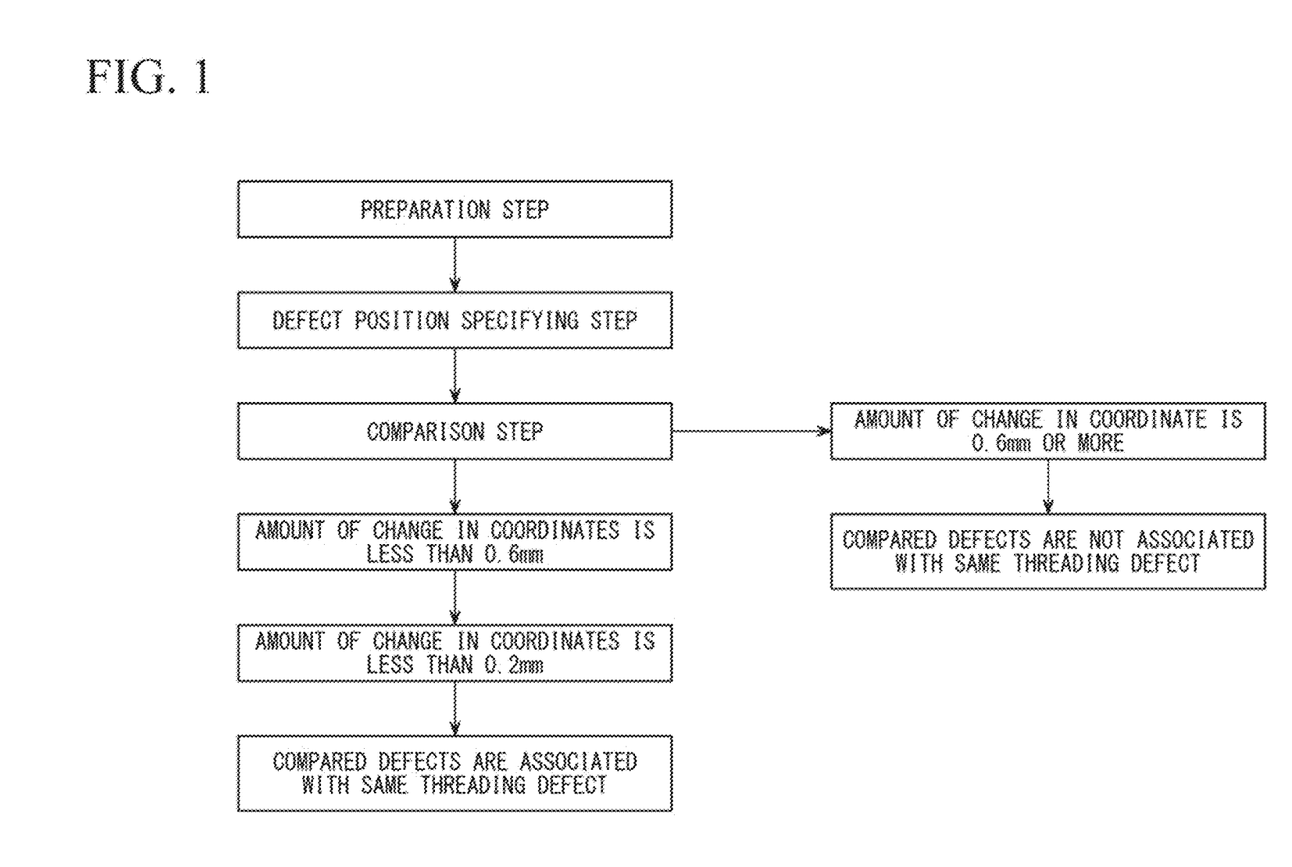
FIG. 1 is a diagram showing an example of a procedure of a method of evaluating a SiC substrate according to the present embodiment.

A method of evaluating a SiC substrate according to a first aspect includes a preparation step of preparing two or more SiC substrates obtained from the same SiC ingot grown from the same seed crystal, a defect position specifying step of specifying positions of defects by observing a main surface of each of the two or more SiC substrates with a microscope, and a comparison step of comparing the positions of the defects of the two or more SIC substrates. FIG. 1 is a diagram schematically showing an example of a method of evaluating a SiC substrate according to the present embodiment. Hereinafter, the method of evaluating a SiC substrate according to the present embodiment will be described in detail.

(Preparation Step)

In the preparation step, two or more SiC substrates obtained from the same SiC ingot grown from the same seed crystal are prepared. A SiC substrate is obtained by slicing a single crystal SiC ingot. Of the two or more SiC substrates for which the method of evaluating a SiC substrate according to the present embodiment is performed, a SiC substrate positioned closest to the seed crystal of the SiC ingot is referred to as a reference wafer.

A threading defect includes a seed-crystal-derived threading defect that extends from an interface between the ingot and the seed crystal as a starting point, and a bulk-growth-derived threading defect that extends from a point inside the SiC ingot (a point other than the interface with the seed crystal) as a starting point. Of these threading defects, a proportion of the seed-crystal-derived threading defects is high. Therefore, the reference wafer is preferably a SiC substrate positioned closest to the seed crystal among a plurality of SiC substrates cut out from the SiC ingot. Also, the threading defects may be blocked and expanded in the SiC ingot. A proportion of the threading defects that are blocked and extended in the SiC ingot starting from the interface with the seed crystal is also high. Therefore, when a substrate close to the seed crystal is used as the reference, that is, the reference wafer, a probability of overlooking the threading defects present in the SiC ingot can be reduced. Also, when the seed-crystal-derived threading defect occurs, there is a high likelihood of the same SiC ingot grown from the same seed crystal having the threading defect at the same position. Therefore, according to the evaluation method of the present invention, a position having a likelihood of being a threading defect in the SiC substrate can be estimated in advance. Further, the method of the present embodiment can be applied to any of the cases in which the seed-crystal-derived threading defect and the bulk-growth-derived threading defect have occurred.

The number of SiC substrates taken out in the preparation step may be any number of two or more. Further, when a correlation determination step to be described below is performed, any number of three or more SiC substrates are prepared. As the number of SiC substrates becomes larger, correlation determination can be performed with higher accuracy. When the correlation determination step is performed, the number of SiC substrates to be taken out is preferably large. For example, the number of SiC substrates may be 2 or more and 20 or less, 3 or more and 15 or less, 5 or more and 10 or less, or the like but the present invention is not limited thereto. The SiC substrate to be evaluated may have an orientation flat indicating a crystal orientation.

(Defect Position Specifying Step)

In the defect position specifying step, a main surface of each of the two or more SiC substrates prepared in the preparation step is observed to specify a position of a defect. The observation of the main surface of the SiC substrate can be performed by surface inspection. The surface inspection can be performed using a known device. For example, a confocal differential interference microscope which is an inspection device (for example, a device with the same principle as SICA88 manufactured by Lasertec Corporation; further, SICA88 may be described as SICA) in which a confocal differential interference microscope and a photoluminescence (PL) observation function are provided in combination, an optical surface inspection device (for example, a device with the same principle as OLYMPUS MX51 manufactured by Olympus Corporation), an electron microscope (for example, a device with the same principle as HD-2300 manufactured by Hitachi High-Technologies Corporation), or the like can be used. Further, in this specification, "main surface of the SiC substrate" refers to a large area portion of the surface of the SiC substrate. When a SiC epitaxial wafer is manufactured, a SiC epitaxial layer can be provided on the main surface of the SiC substrate.

Figure 2:
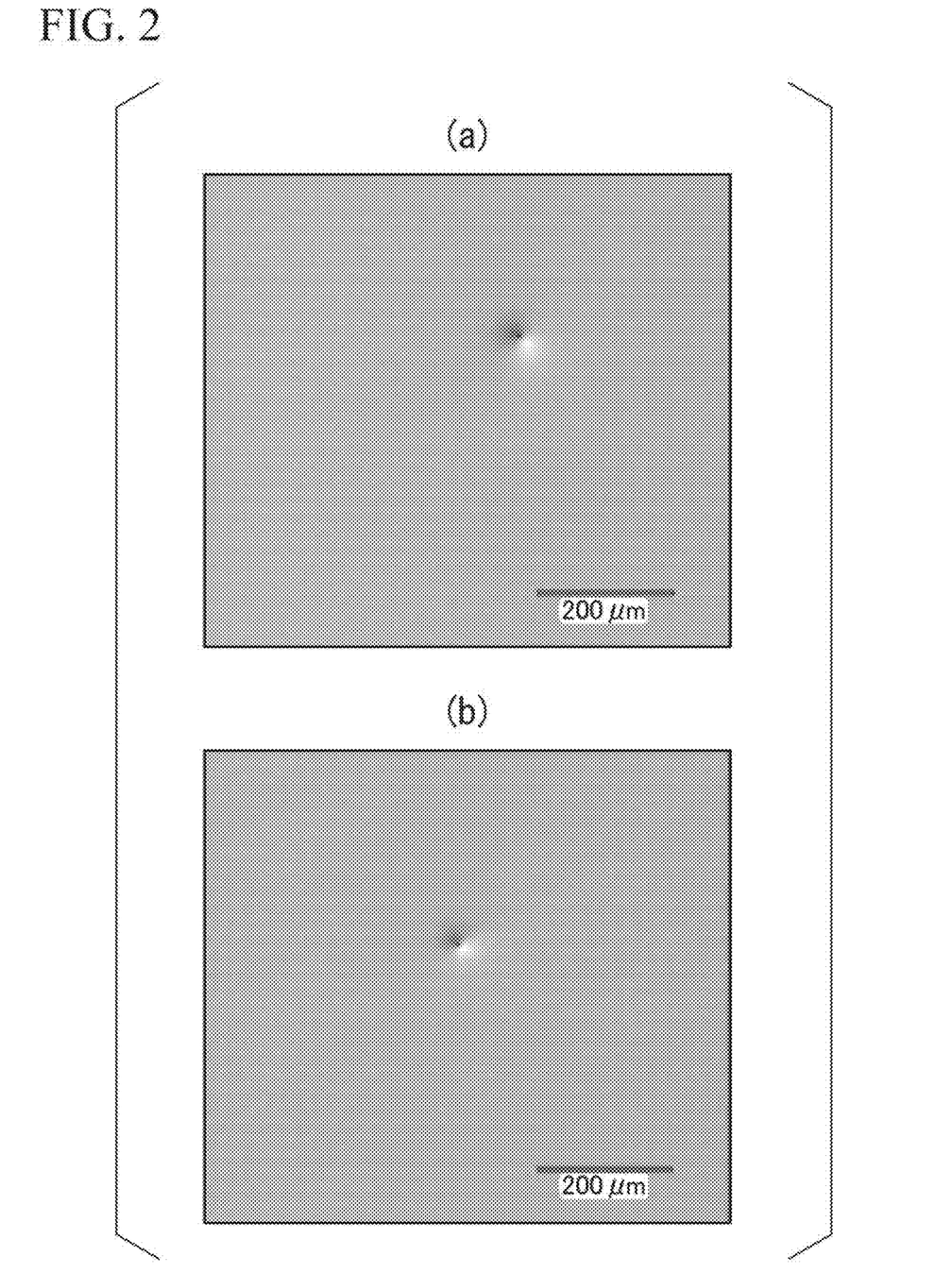
FIG. 2 is a view showing examples of SICA images of SiC substrates described in the present embodiment.
Figure 3:
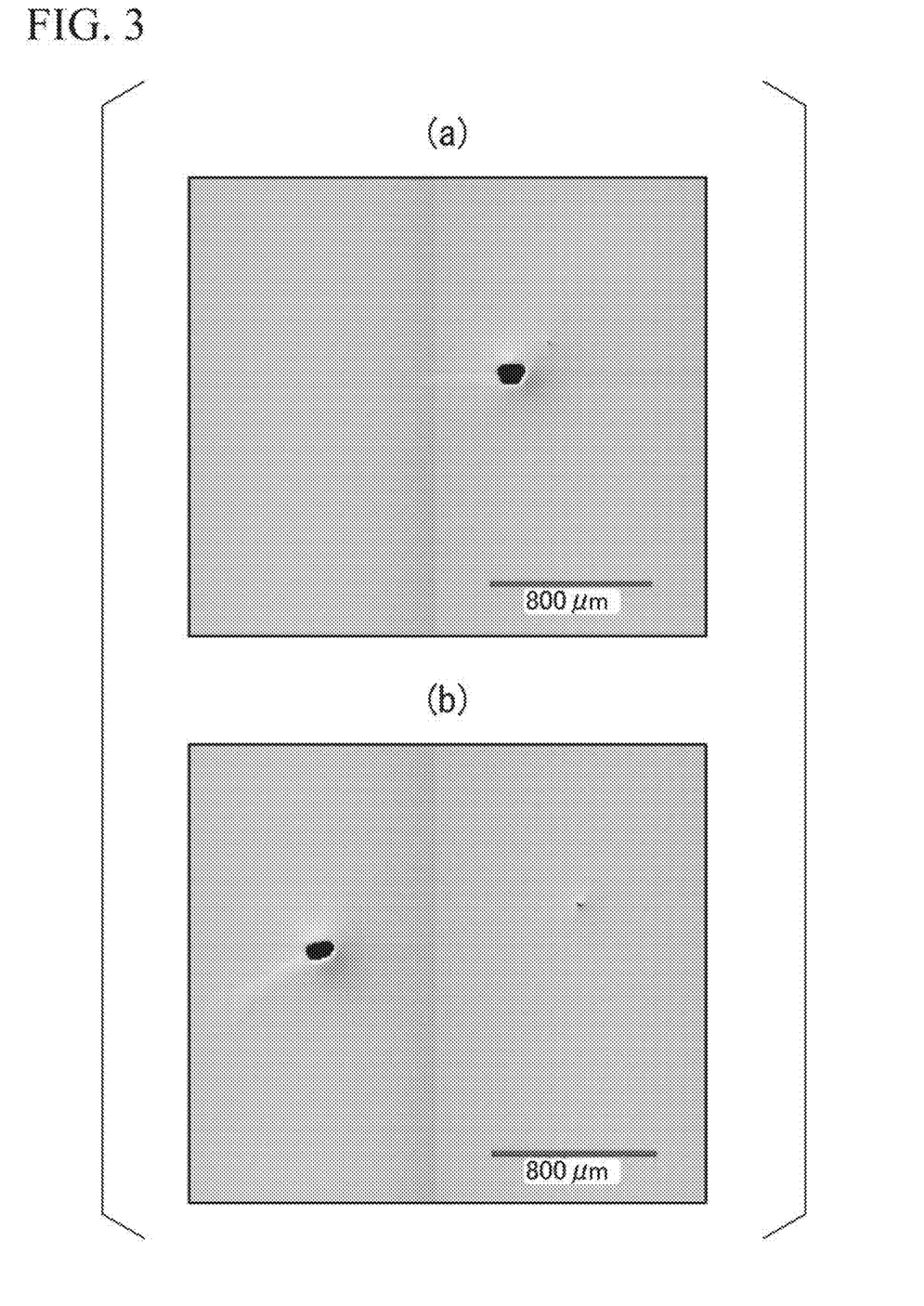
FIG. 3 is a view showing examples of SICA images of SiC substrates described in the present embodiment.

FIGS. 2 and 3 are microscope images obtained by observing a main surface of a SiC substrate using SICA (hereinafter referred to as SICA images). The above-described SICA is an inspection device in which a confocal differential interference microscope and a photoluminescence (PL) observation function are provided in combination. Images (a) and (b) shown in FIG. 2 are SICA images of different SiC substrates obtained from the same SiC ingot grown from the same seed crystal. Similarly, images (a) and (b) shown in FIG. 3 are also SICA images of different SiC substrates obtained from the same SiC ingot grown from the same seed crystal. Further, the SiC substrates whose SICA images are shown in FIGS. 2 and 3 are different SiC substrates obtained from different SiC ingots grown from different seed crystals. That is, the substrate shown in FIG. 2 and the substrate shown in FIG. 3 are formed from different ingots.

Defects recognized as defects in the defect position specifying step are defects determined by arbitrarily selected criteria. For example, in an image obtained using the PL observation function of the SICA, luminance S of a portion that emits light and is considered to be a defect, luminance N of a portion that does not emit light and is considered to be a non-defective part, and a ratio (S/N A ratio) therebetween may be obtained, and then a point (portion which emits light) having the above-described ratio of 2.0 or more may be recognized as a defect. Further, a defect whose position is specified in the defect position specifying step may be a defect detected using arbitrarily selected devices and determined by arbitrarily selected criteria.

Figure 4:
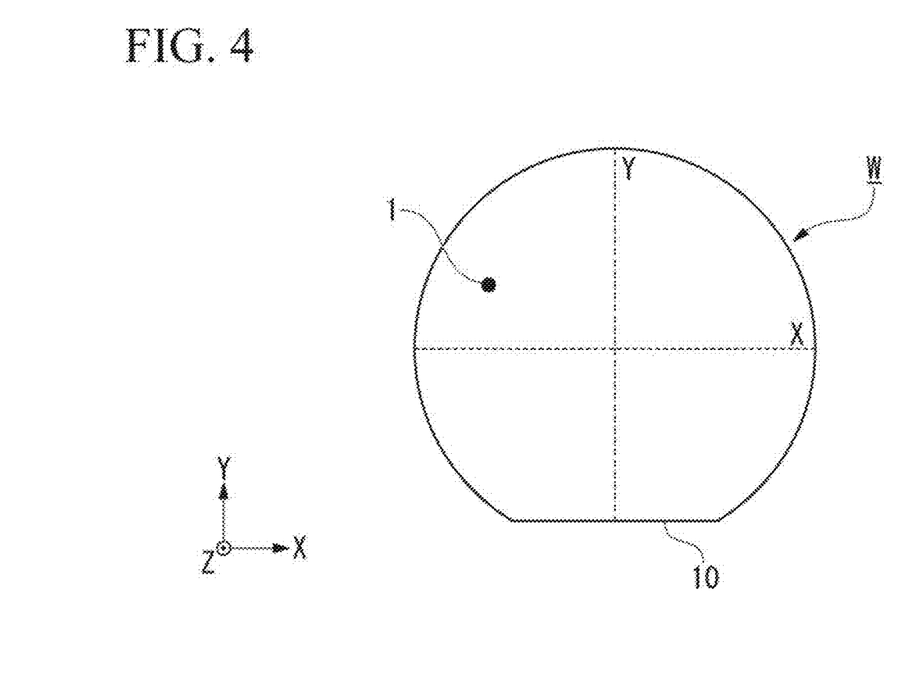
FIG. 4 is a top view schematically illustrating an example of a SiC substrate evaluated in the present embodiment.

FIG. 4 is a schematic view illustrating an example of an upper surface of a SiC substrate W on which the defect position specifying is performed. The SiC substrate W illustrated in FIG. 4 has an orientation flat 10. In the defect position specifying step, for a defect position of a recognized defect 1, for example, an X component (a position coordinate in an X direction; an X direction component) and a Y component (a position coordinate in a Y direction; a Y direction component) illustrated in FIG. 4 may be specified. Further, in FIG. 4, an index in the X direction is [11-20] and an index in the Y direction is [1-100]. The position coordinate may be an orthogonal coordinate wherein the center of wafer is provided as a center thereof. However, the position coordinate is not limited thereto. Currently, a 4H-type SiC substrate which has an offset angle 4° in a [11-20] direction is used as a 4H-type SiC substrate for power device. In the substrate, the angle of the X direction is different from that of the [11-20] direction such that the angle between them is 4°. In this case, the defect distance in the [11-20] direction may be obtained based on orthogonal projection using a position coordinate in an X direction on a main surface where defects are observed. That is, it is possible to obtain a target defect distance and the position coordinate in the [11-20] direction by projecting the two defects which present on the main surface and the distance between the defects to an inclined face of 4°.

For example, when a 4H-type SiC substrate (wafer) which does not have an offset angle is used, the position coordinate may be provided on the surface of the substrate as an orthogonal coordinate wherein the center of the wafer is provided as a center of the coordinate, and the [11-20] direction may represent an X direction of the wafer and the [1-100] direction may represent an Y direction of the wafer. In such a case, the defect distance in a [11-20] direction (X direction) may be obtained as an absolute value of the difference (X−x) which is obtained from a position coordinate (X, Y) of a first defect of the reference wafer and a position coordinate (x, y) of a second defect of a SiC substrate other than the reference wafer.

When a 4H-type SiC substrate (wafer) which has an offset angle 4° in a [11-20] direction is used, the position coordinate A may be provided on the surface of the substrate as an orthogonal coordinate wherein the center of the wafer is provided as a center of the coordinate, and the position coordinate B may also be provided as an orthogonal coordinate wherein the center of the wafer is provided as a center of the coordinate, and has a lean of 4° in a [11-20] direction. The X-axis of the position coordinate A and the X-axis of the position coordinate B may be aligned in plane view. In such a case, the defect distance in a [11-20] direction may be obtained as an absolute value of the difference (X'−x') which is obtained from a position coordinate (X', Y') of the position coordinate B, which is projected from the a position coordinate (X, Y) of the position coordinate A of a first defect of the reference wafer, and a position coordinate (x', y') of the position coordinate B, which is projected from the a position coordinate (x, y) of the position coordinate A of a second defect of a SiC substrate other than the reference wafer. The defect distance in a [11-20] direction may be obtained as a value of cos 4° x (an absolute value of the difference (X−x)).

(Comparison Step)

In the comparison step, positions of defects are compared for two or more SiC substrates. In the comparison step, a defect position of the reference wafer (reference SiC substrate) is compared with a defect position of a comparison wafer (comparison SiC substrate). The comparison wafer is another SiC substrate obtained from the same SiC ingot from which the reference wafer is obtained. In the comparison step, defects present in the reference wafer and defects present in the comparison wafer are compared for arbitrarily selected combinations. In the comparison step, it is preferable to compare all the combinations of the defects observed in the reference wafer and the defects observed in the comparison wafer.

In the comparison step, the defects of the reference wafer and the defects of the comparison wafer are compared. In the comparison step, a distance between a defect of the reference wafer and a defect of the comparison wafer, specifically, a defect distance between these defects in the [11-20] direction, is obtained. The defect distance may be a difference obtained from numerical values of coordinates of the two defects described above. The substrates may have an offset angle 4° in a [11-20] direction, and the defect distance in the [11-20] direction may be obtained based on the numerical values of position coordinates in an X direction of the two defects. When the defect distance is 0.6 mm or more, the two compared defects are judged to be defects not associated with the same threading defect. Also, when the defect distance between the defect of the reference wafer and the defect of the comparison wafer in the [11-20] direction is less than 0.2 mm, the two compared defects are judged to be defects associated with the same threading defect. Although details will be described below, this judgment criterion is based on a result of investigation on positional relationships of threading defects in a large number of SiC ingots. When the defect distance between the defect of the reference wafer and the defect of the comparison wafer in the [11-20] direction is 0.6 mm or more, it is thought to be statistically unlikely that the two defects on different compared wafers are defects associated with the same threading defect. On the other hand, when the defect distance between the defect of the reference wafer and the defect of the comparison wafer in the [11 -20] direction is within 0.2 mm, it is statistically probable that the two defects on different compared wafers are defects associated with the same threading defect.

When the comparison step is performed, it is possible to recognize whether or not the defects in the reference wafer and the comparison wafer are defects apparently associated with the same threading defect. Also, when the comparison step is performed, it can also be recognized that the defects in the reference wafer and the comparison wafer are defects apparently not associated with the same threading defect. When the comparison step is performed, a combination of defects apparently associated with the same threading defect and a combination of defects apparently not associated with the same threading defect can be screened and distinguished. That is, when the method of evaluating a SiC substrate according to the present embodiment is performed, a portion that may cause a defective characteristic of the wafer can be screened in advance. By screening a portion that may cause a defective characteristic, the yield of the SiC device improves.

Also, the surface inspection is often performed after the SiC substrate is fabricated. Therefore, the method of evaluating a SiC substrate according to the present embodiment does not require an additional cumbersome inspection with respect to the existing inspection and is simple. Also, the surface inspection is a nondestructive inspection, and the method of evaluating a SiC substrate according to the present embodiment is performed efficiently at a low cost.

Also, in the method of evaluating a SiC substrate according to the present embodiment, the defect position specifying step may also be a step of observing only the main surface of the substrate in any of the two or more SiC substrates. Therefore, unlike a step of observing both a main surface and a back surface, there is no need to convert position coordinates thereof. In this respect also, the method of evaluating a SiC substrate according to the present embodiment is simple.

Also, with only a surface inspection performed for one SiC substrate, it is difficult to distinguish the threading defect from a carbon inclusion or the like or a defect caused thereby. However, the method of evaluating a SiC substrate according to the present embodiment can be used to distinguish the threading defect from a carbon inclusion or the like or a defect caused thereby by performing the defect position specifying step for two or more SiC substrates.

Here, in order to perform more accurate evaluation regarding the aforementioned defects in the reference wafer and the comparison wafer, it is preferable to judge whether or not a defect distance in a [1-100] direction of the aforementioned two defects is 0.2 mm or less. It is preferable that a defect distance of the two defects in a [1-100] direction is not 0.6 mm or more, it is more preferable that the defect distance is 0.2 mm or less, and it is still more preferable that the defect distance is less than 0.2 mm. When the defect distance thereof in a [1-100] direction is 0.2 mm or less, a probability that the two compared defects are defects associated with the same threading defect becomes still higher.

For example, the judgement described below can be performed.

(i) With respect to the aforementioned two defects, when a defect distance thereof in a [11-20] direction is less than 0.2 mm and a defect distance thereof in a [1-100] direction is 0.2 mm or less, there is a very high probability that the two defects are defects associated with the same threading defect.

(ii) With respect to the aforementioned two defects, when a defect distance thereof in a [11-20] direction is 0.2 mm or more and less than 0.6 mm and a defect distance thereof in a [1-100] direction is 0.2 mm or less, there is a high probability that the two defects are defects associated with the same threading defect, although whether or not the defects are associated with the same threading defect is judged in the correlation determination step.

(iii) With respect to the aforementioned two defects, when a defect distance thereof in a [11-20] direction is 0.6 mm or more and a defect distance thereof in a [1-100] direction is 0.2 mm or less, the defects are determined to be defects not associated with the same threading defect.

(iv) With respect to the aforementioned two defects, when a defect distance thereof in a [11-20] direction is less than 0.2 mm and a defect distance thereof in a [1-100] direction exceeds 0.2 mm, a probability that the two defects are defects associated with the same threading defect is lower than that obtained in (i).

(v) With respect to the aforementioned two defects, when a defect distance thereof in a [11-20] direction is 0.2 mm or more and less than 0.6 mm and a defect distance thereof in a [1-100] direction exceeds 0.2 mm, a probability that the two defects are defects associated with the same threading defect is lower than that obtained in (ii), although whether or not the defects are associated with the same threading defect is judged in the correlation determination step.

(vi) With respect to the aforementioned two defects, when a defect distance thereof in a [11-20] direction is 0.6 mm or more and a defect distance thereof in a [1-100] direction exceeds 0.2 mm, the defects are determined to be defects not associated with the same threading defect.

The defect distance in a [1-100] direction may be obtained by the same method as the defect distance in a [11-20] direction.

(Identification Step)

An identification step may be performed after the comparison step. The identification step is a step of estimating a position of a threading defect present in another SiC substrate taken out from the same SiC ingot, that is, a SiC substrate other than the reference wafer and the comparison wafer, on the basis of the position coordinates of the defects specified in the defect position specifying step and the result of the comparison step. The identification step is performed by appropriately reflecting a step flow direction and an offset angle of the SiC substrate. Although the above-described position coordinates may be orthogonal coordinates with a center of the wafer as a center, the position coordinates are not limited thereto.

In the identification step, a region in which a defect associated with the same threading defect is present in another SiC substrate taken out from the same SiC ingot is estimated on the basis of, for example, a branch number indicating an order of the two SiC substrates of which the defects have been compared, position coordinates of the defects in each of the two SiC substrates, and a recognition result for the same threading defects. The branch number indicates a position of the SiC substrate in the same SiC ingot. For example, a smaller number, for example, a number starting with 1 or the like, may be sequentially provided to the SiC substrates obtained from the ingot in order from the side closer to the seed crystal. For example, when the branch number is "2," it may indicate a second SiC substrate from the seed crystal. In this case, the branch number of the reference wafer is 1. The branch number does not have to be assigned with a smaller number in order from the side closer to the seed crystal, and the system may be reversed. In the present step, for example, when a graph is plotted with the branch number as a horizontal axis and the defect position as a vertical axis, it is possible to predict position coordinates of a defect in a SiC substrate of a branch number other than the two SiC substrates whose defects have been compared.

When the identification step is performed, it is not necessary to actually check each of SiC substrates, SiC epitaxial wafers, SiC chips, or the like obtained from the same SiC ingot individually. When the present step is performed, it is possible to specify or predict a position in which a device killer defect may be present for the SiC substrates obtained from the same SiC ingot. Due to the screening in the identification step, a throughput for fabricating SiC epitaxial wafers improves. In the method of evaluating a SiC substrate according to the present embodiment, using a larger number of SiC substrates is more preferable from the perspective of performing the identification step with high accuracy. On the other hand, considering time and effort for the observation, the number of SiC substrates to be used is preferably close to two.

(Correlation Determination Step)

When a defect distance in the [11-20] direction between the two defects compared in the comparison step is 0.2 mm or more and less than 0.6 mm, it is preferable to perform the correlation determination step after the comparison step. As described above, the threading defect is a device killer defect. Missing a threading defect causes more problems than erroneously recognizing a defect that is not a threading defect as a threading defect. Although all defects falling within the range may be judged to be defects associated with the same threading defect, it is preferable for the screening to be able to be performed with higher accuracy.

When the correlation determination step is performed, it is possible to accurately recognize whether or not defects having a defect distance of 0.2 mm or more and less than 0.6 mm in the [11-20] direction are defects associated with the same threading defect. Further, the defect distance may be obtained as a difference between position coordinates such as X coordinates of two defects that are compared. When the substrates have an offset angle 4° in a [11-20] direction, the defect distance in the [11-20] direction may be obtained based the numerical values of position coordinates in an X direction of the two defects.

In order to perform the correlation determination step, three or more SiC substrates obtained from a SiC ingot grown from the same seed crystal are prepared in the preparation step. Then, the defect position specifying step is performed for each of the SiC substrates. Hereinafter, for the sake of convenience, of the two defects in the two wafers compared in the comparison step, the defect present in the reference wafer (a first wafer) will be referred to as a first defect, and the defect present in the comparison wafer (a second wafer) will be referred to as a second defect. When the correlation determination step is performed, a third defect present in a SiC substrate (a third wafer) other than the reference wafer and the comparison wafer and a defect position thereof are specified. The third defect is a defect whose defect distances from itself to the first defect and the second defect in the [11-20] direction are each less than 0.6 mm.

In the correlation determination step, a determination coefficient (correlation determination coefficient) $R^2$ is obtained from each of the positions of the first defect, the second defect, and the third defect and each of the branch numbers of the SiC substrates having the first defect, the second defect, and the third defect. Then, for example, when the determination coefficient $R^2$ is 0.7 or more, the first defect, the second defect, and the third defect are judged to be defects associated with the same threading defect. Also, the determination coefficient $R^2$ can be changed depending on a required accuracy of the screening. For example, when the determination coefficient $R^2$ is 0.5 or more, the first defect, the second defect, and the third defect may be judged to have a high likelihood of being defects associated with the same threading defect.

Here, in order to obtain the determination coefficient, X direction components (position coordinates in the X direction) of the first defect, the second defect, and the third defect, and branch numbers of the SiC substrates in which each of the defects are present are required. When (branch number, X direction component of a defect)=(n, x), a covariance is $s_{nx}$, a standard deviation of branch numbers is $s_n$, and a standard deviation of position coordinates of defects is $s_x$, the determination coefficient $R^2$ is obtained by $R^2=\{s_{nx}/s_n \times s_x)\}^2$. That is, when the number of SiC substrates used in the correlation determination step is N, an order of the SiC substrate from the seed crystal side is i, a branch number of the i-th SiC substrate from the seed crystal side is $n_i$, an X direction component of a defect that determines a correlation is $x_i$, and an arithmetic mean of the branch numbers and the X direction components are $n_a$ and $x_a$, the determination coefficient $R^2$ can be obtained using the expression 1 described below.

$$R^2 = \frac{\left\{\sum_{i=1}^{N}(n_i - n_a)(x_i - x_a)\right\}^2}{\left\{\sum_{i=1}^{N}(n_i - n_a)^2\right\} \times \left\{\sum_{i=1}^{N}(x_i - x_a)^2\right\}}$$ [Expression 1]

Further, for the "branch number" of the SiC substrate in the present embodiment, a method of assigning the branch number is assumed such that the branch number becomes larger in order from the seed crystal side. For example, a method of assigning the branch number in which the branch number becomes larger in order such as 1, 2, 3, ... from the seed crystal side is assumed. However, as described above, there is also a method of assigning the branch number in which the branch number becomes smaller in order from the seed crystal side. For example, there is also a method of assigning the branch number in which SIC substrates obtained from a SiC ingot from which 10 SiC substrates can be obtained have branch numbers that become smaller in order such as 10, 9, 8, ... from the seed crystal side. The method of evaluating a SiC substrate according to the present embodiment can be applied to the SiC substrates having either methods of assigning the branch number. For example, when the method of evaluating a SiC substrate according to the present embodiment is applied to the SiC ingot using the method of assigning the branch number in which the branch number becomes smaller in order from the seed crystal side, a number obtained by "(the number of SiC substrates that can be obtained from the SiC ingot)−(a branch number; a branch number becoming smaller in order from the seed crystal side)+1" may be applied as the "branch number" of the above-described embodiment. For example, when a SiC ingot having the method of assigning the branch number in which the branch number becomes smaller in order from the seed crystal side is used, and 10 SiC substrates can be obtained from the SiC ingot, a branch number of the third SiC substrate from the seed crystal side according to the above-described assigning method is originally 8. However, when the present embodiment is applied, "3" may be used as the "branch number" from a calculation result of (10−8+1=3).

In the correlation determination step, the determination coefficient may be obtained after creating approximate straight lines for X direction positions of the first defect, the second defect, and the third defect, and branch numbers of the SiC substrates having each of the defects.

Hereinafter, in the method of evaluating a SiC substrate according to the present embodiment, an example of a case in which the comparison step and the correlation determination step are performed for defects whose positions have been specified in the defect position specifying step will be described with reference to the drawings.

Figure 5:
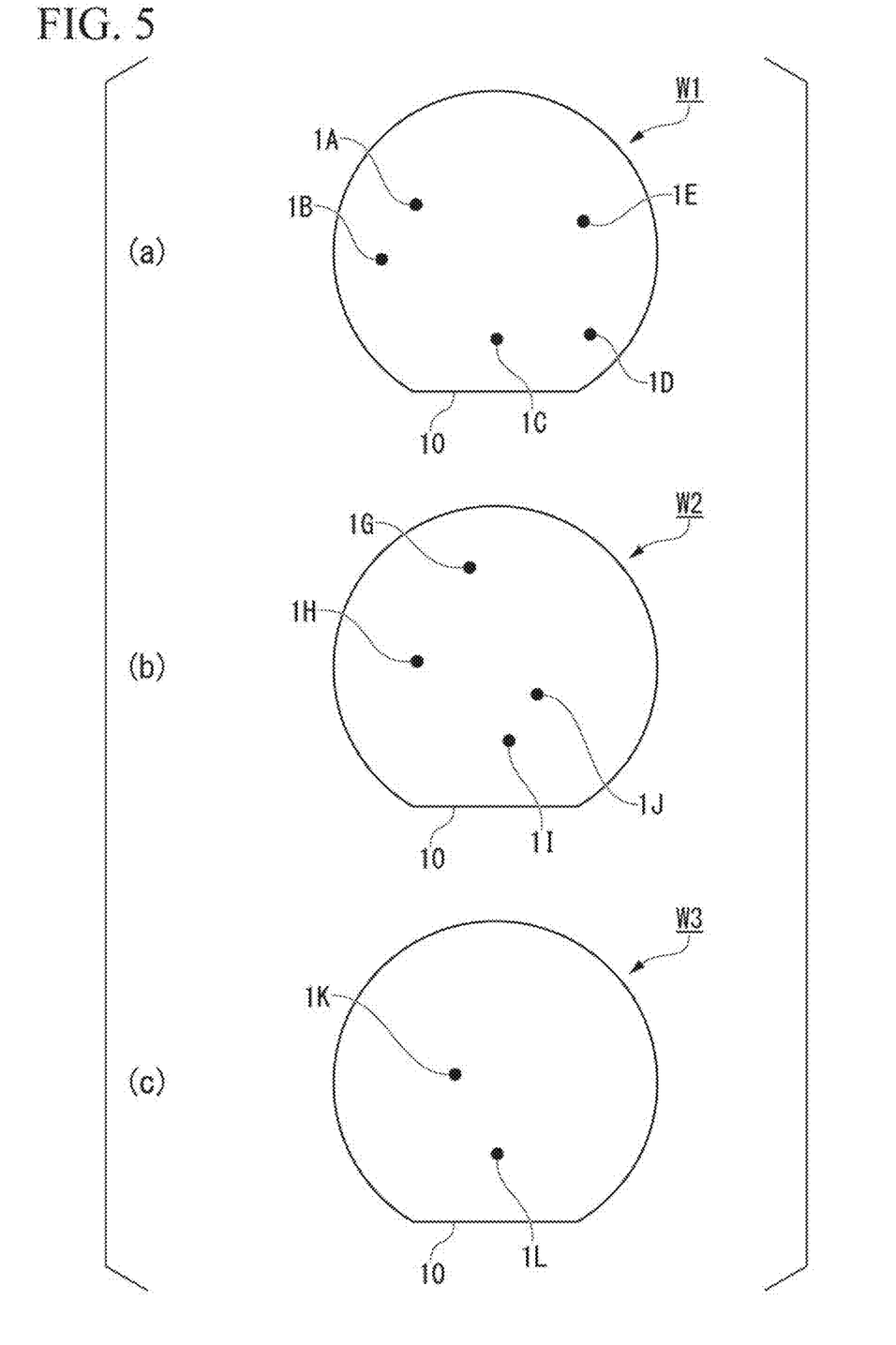
FIG. 5 is a top view schematically illustrating examples of SiC substrates evaluated in the present embodiment.

FIG. 5 is a schematic top view of three SiC substrates on which the defect position specifying step has been performed. (a) of FIG. 5 is a schematic top view of a reference wafer W1. The reference wafer W1 (the first wafer) is a SiC substrate positioned closest to a seed crystal among the three SiC substrates illustrated in FIG. 5. (b) and (c) of FIG. 5 are schematic top views of a comparison wafer W2 (the second wafer) and a comparison wafer W3 (the third wafer). The comparison wafer W2 is positioned closer to the reference wafer WI than the comparison wafer W3. Similarly to FIG. 4, in FIG. 5, a direction of a straight line of the orientation flat, that is, the X direction, is [11-20], and the Y direction is [1-100]. Currently, a 4H-type SiC substrate which has an offset angle 4° in a [11-20] direction is used as a 4H-type SiC substrate for power device. In the substrate, the difference between the angle of the X direction and the [11-20] direction is 4°. In this case, the defect distance in the [11-20] direction may be obtained, for example, using orthogonal projection based on a position coordinate in an X direction located on a main surface. That is, it is possible to obtain a target defect distance and the position coordinate in the [11-20] direction by projecting the two defects which present on the main surface and the distance between the defects to an inclined plane of 4°.

In the defect position specifying step, position coordinates of five defects 1A to 1E present in the reference wafer W1, four defects 1G to 1I present in the comparison wafer W2, and two defects 1K to 1L present in the comparison wafer W3 have each been specified. In the comparison step, the position coordinates of the defects present in the reference wafer W1 and the comparison wafer W2 or the position coordinates of the defects present in the reference wafer W1 and the comparison wafer W3 are arbitrarily selected and the coordinates thereof are compared. Further, the defects that are closest to each other in a plan view and are in different wafers are preferably compared at the least. As an example of the comparison, for example, when the reference wafer W1 and the comparison wafer W2 are compared, the position coordinates of the defect 1A of the reference wafer W1 may be compared with the position coordinates of each of the defects 1G to 1J. Also, comparison of all the position coordinates of the defects 1A to 1E with the position coordinates of the defects 1G to 1J may each be performed. When all the position coordinates of the defects 1A to 1E are compared with the position coordinates of the defects 1G to 1J, for example, a defect distance between the defect 1C and the defect 1I in the [11-20] direction is assumed to be 0.2 mm or less, and a defect distance therebetween in the [1-100] direction is assumed to be 0.2 mm or less. In this case, the defect 1C and the defect 1I are recognized as defects associated with the same threading defect. For example, as in a case between the defect 1A and the defect 1H, even when a defect distance therebetween in the [11-20] direction is less than 0.2 mm, when a defect distance therebetween in the [1-100] direction is 0.2 mm or more, for example, a defect distance therebetween in the [1-100] direction is 0.6 min or more, they may be recognized as defects which are not associated with the same threading defect. In comparison, a difference in position coordinates of two defects may be referred to as the defect distance therebetween.

Also, for example, as in a relationship between the defect 1B and the defect 1H, when a defect distance therebetween in the [11-20] direction is 0.2 mm or more and less than 0.6 mm, and a defect distance therebetween in the [1-100] direction is 0.2 mm or less, it is preferable to perform the correlation determination step to recognize whether or not the defects are associated with the same threading defect. In the correlation determination step, the comparison wafer W3 is used in addition to the reference wafer W1 and the comparison wafer W2. The defect 1K present in the comparison wafer W3 has a defect distance of less than 0.6 mm in the [11-20] direction with respect to, for example, both the defect 1B and the defect 1H. In the correlation determination step, the determination coefficient $R^2$ is obtained from the above-described expression on the basis of the branch numbers of the reference wafer W1, the comparison wafer W2, and the comparison wafer W3, and the position coordinates (for example, the position coordinates in the X direction) of the defect 1B, the defect 1H, and the defect 1K. When the determination coefficient $R^2$ is 0.7 or more, the defect 1B, the defect 1H, and the defect 1K can be recognized as defects associated with the same threading defect. Also, the determination coefficient $R^2$ may be 0.5 or more depending on the accuracy of the screening.

In combinations between the defects of the reference wafer W1 and the defects of the comparison wafer W2 other than the defect 1A and the defect 1H, the defect 1B and the defect 1H, and the defect 1C and the defect 1I, the defects are recognized as not being associated with the same threading defect when the defect distances therebetween in the [11-20] direction are each 0.6 mm or more, and/or a defect distance in the [1-100] direction is 0.2 mm or more, the defects may be recognized as not being associated with the same threading defect.

Figure 6:
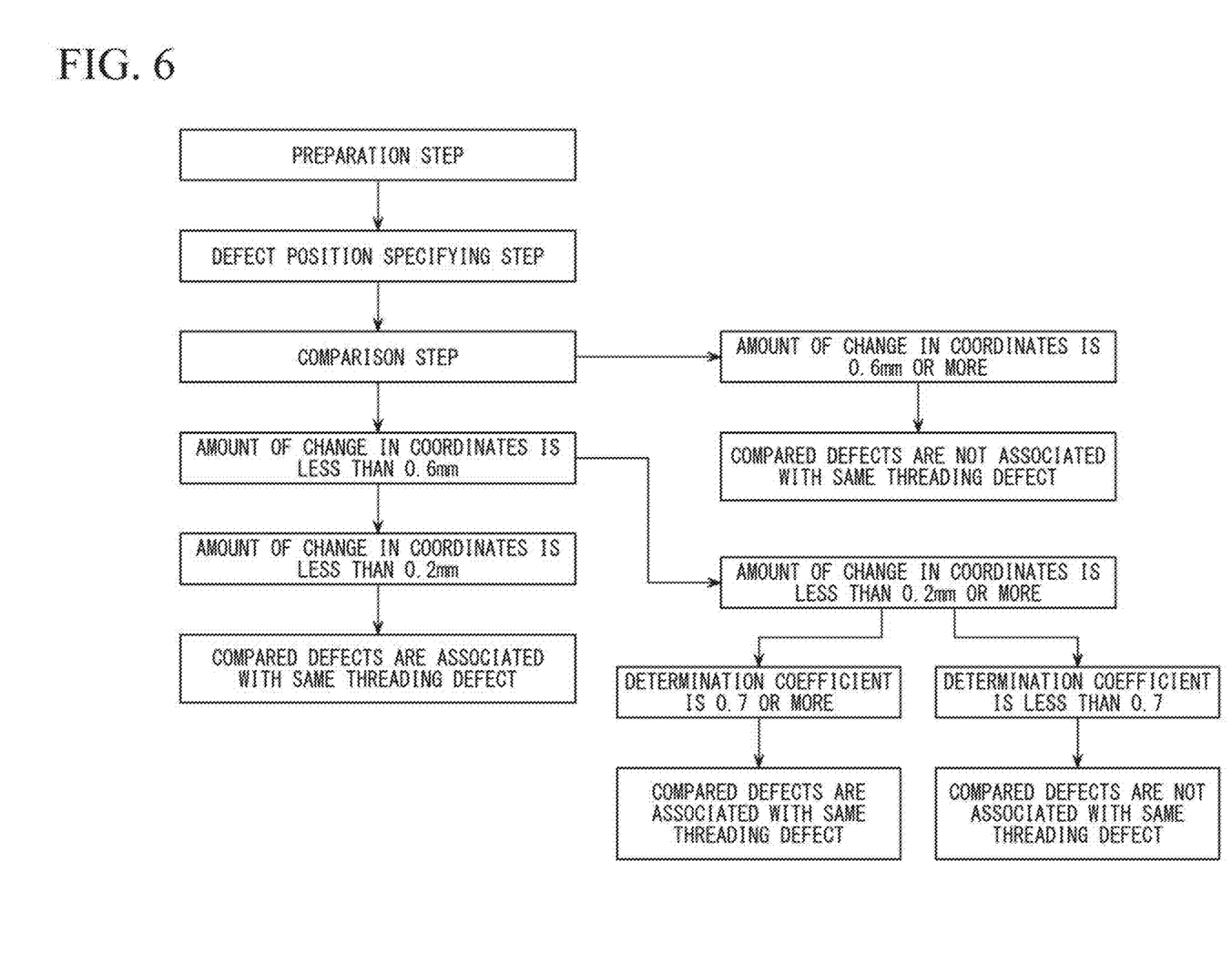
FIG. 6 is a diagram showing an example of a procedure of the method of evaluating a SiC substrate according to the present embodiment.

FIG. 6 is a diagram showing a procedure of the method of evaluating a SiC substrate according to the present embodiment. In FIG. 6, 0.7 is set as a threshold value of the determination coefficient of whether or not compared defects are defects associated with the same threading defect. Further, when the threshold value is set to 0.5, defects whose likelihood of being associated with the same threading defect is high can be recognized, and therefore 0.5 may also be applied as the threshold value.

When the correlation determination step is performed for the defects having the defect distance of 0.2 mm or more and less than 0.6 mm in the [11-20] direction, a defect having a likelihood of being a threading defect can be strictly recognized. That is, the reliability of the SiC substrate can be improved.

Figure 7:
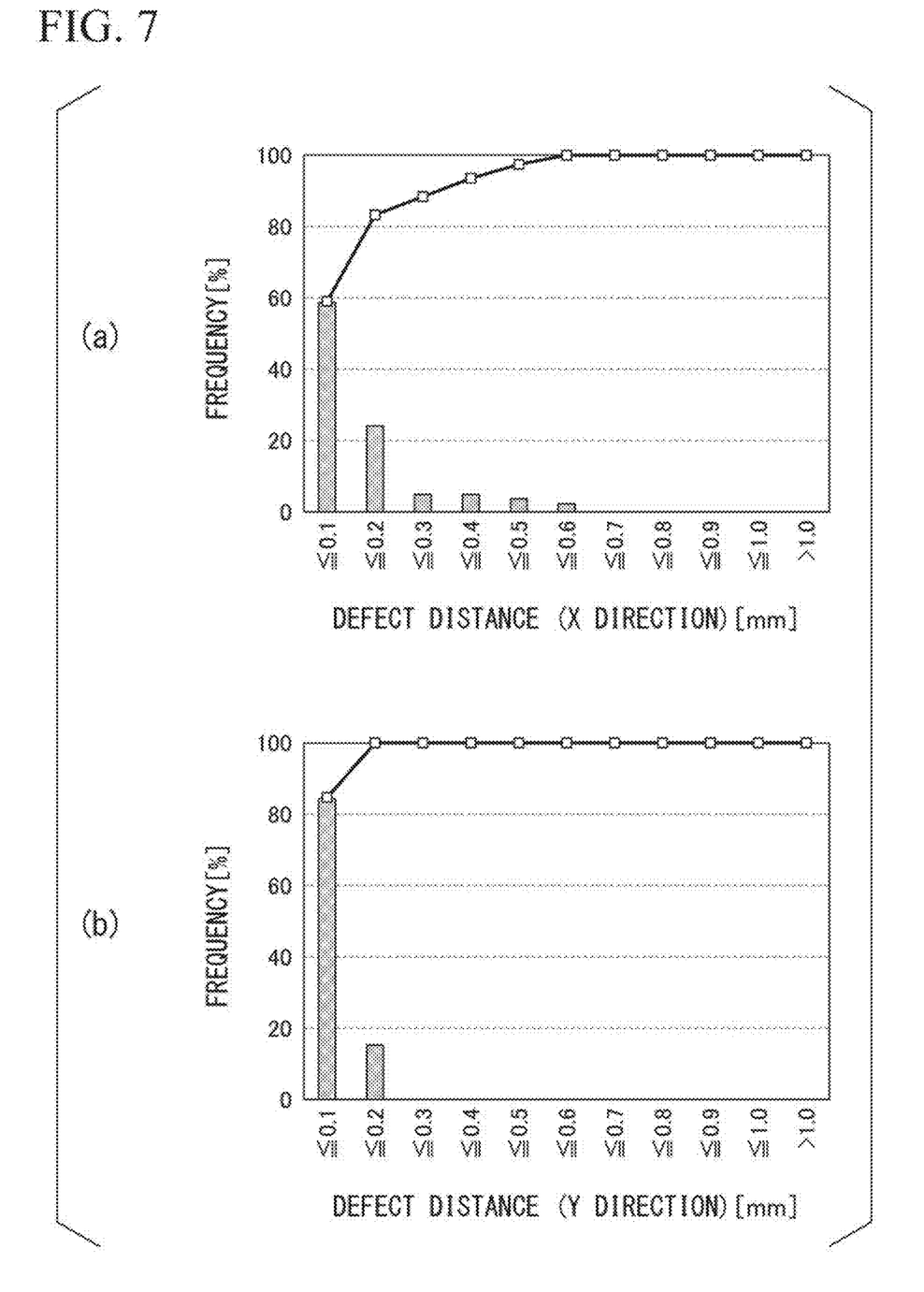
FIG. 7 is a histogram in which defect distances of threading defects present in the SiC substrate described in the present embodiment are aggregated.

(a) and (b) of FIG. 7 show results in which 80 threading defects have been inspected for a distance relationship between defects formed from the same threading defect and present in different substrates. Specifically, FIG. 7 shows histograms in which position coordinates in each of the X direction and the Y direction of 99 substrates among a plurality of substrates, which are obtained from 15 SiC ingots, were inspected and aggregated regarding threading defects present in 6-inch SiC substrates, and then a standard deviation of defect positions of the threading defects and their frequencies (vertical axis) were aggregated. A total of 80 threading defects were present in the 15 SiC ingots used for the inspection. Here, the same threading defect that extended across a plurality of SiC substrates was counted as one threading defect regardless of the number of SiC substrates through which the threading defect extended. That is, in the graphs shown in (a) and (b) of FIG. 7, a total of the frequency (100%) shown on the vertical axis is 80, which is the same as the number of threading defects. One threading defect extends across a plurality of substrates. Therefore, the total number of threading defects ascertained on the inspected SiC substrates was about 23000, which is a larger number than 80 which was the number of threading defects. For these defects, defect distances were obtained as the standard deviation of the defect positions.

The position coordinates of the 80 threading defects whose results are shown in FIG. 7 were not investigated by applying the method of evaluating a SiC substrate according to the present embodiment. The results shown in FIG. 7 were obtained on the basis of position coordinates of the threading defects recognized by a method described in Japanese Unexamined Patent Application, First Publication No. 2006-286893 or a method of performing a surface inspection for both surfaces of the SiC substrates. In the evaluation shown in FIG. 7, the X direction is the [11-20] direction and the Y direction is the [1-100] direction. That is, (a) of FIG. 7 is a histogram for defect distances of the threading defects in the [11-20] direction. (b) of FIG. 7 is a histogram for defect distances of the threading defects in the [1-100] direction. That is, the horizontal axes in the graphs of (a) and (b) of FIG. 7 represent standard deviations of the defect positions (defect distances) in the [11-20] direction of the defects formed along with the same threading defects observed on the plurality of substrates. The vertical axes in the graphs of (a) and (b) of FIG. 7 represent frequencies. The defect distances were obtained for each of the threading defects. The above-described standard deviations were obtained on the basis of the defect distances of the defects. Further, the standard deviations were obtained using the expression 2 described below. Specifically, when one threading defect is present in the SiC substrates of branch numbers 1 to 10, an X coordinate of the threading defect present in the SiC substrate whose branch number is i (i-th) among the substrates is $x_i$, and an arithmetic mean of the X coordinates of the threading defect in the above-described SiC substrate is $x_a$, a standard deviation s of the threading defect in the X direction was obtained using the expression 2 described below.

$$s = \sqrt{\frac{1}{10}\sum_{i=1}^{10}(x_i - x_a)^2}$$ [Expression 2]

According to the aggregation of the histogram shown in FIG. 7, the standard deviations of the positions in the Y direction were 0.1 or less in most of the 80 inspected threading defects, and the standard deviations of the positions in the Y direction were 0.2 mm or less in all the threading defects. Also, among the 80 inspected threading defects, the standard deviations of the positions in the X direction of 0.2 or less were 83.3% of the total, and the standard deviations of all the inspected threading defects were 0.6 or less. The standard deviations s in the X direction whose proportion of the frequency corresponding to 68.3% were 0.2 or less. The standard deviations s in the X direction whose proportion of the frequency corresponding to 99.7% were 0.6 or less.

In the threading defects having the standard deviation in the X direction in the range of 0.2 or more and 0.6 or less, there were a large number of threading defects having a good correlation between the branch number and the defect distance. In other words, a dependence of increase/decrease in the branch number and increase/decrease in the defect distance was ascertained in a large number of threading defects in that range. While there was no threading defect having the standard deviation in the Y direction in a range of more than 0.2, there were threading defects having the standard deviation in the X direction in a range of 0.2 or more. As one of the causes, an offset angle of the seed crystal is cited. An influence of a difference in the offset angle of the seed crystal on a threading defect will be described below in detail with reference to FIG. 8. As a brief description of the influence of the offset angle, the position of a threading defect that has grown linearly in a lamination direction of the SIC ingot is caused to be deviated for each substrate to be cut when a SiC ingot having no offset angle is obliquely cut at the time of obtaining substrates. An angle at which a SiC ingot is cut and a growth direction of a specific threading defect are each constant. Due to this, the threading defect formed as above has a good correlation between the defect distance in the X direction and the branch number. Defects having the determination coefficient $R^2$ equal to or less than a predetermined value in the correlation determination step have a poor correlation, that is, a low correlation, and therefore are judged not to be threading defects associated with the same threading defect.

The image (a) and the image (b) of FIG. 2, and the image (a) and the image (b) of FIG. 3 are SICA images at the same position of different SiC substrates each having a defect associated with the same threading defect. Further "same position" may be understood as a position at which coordinates in the substrates are the same. The threading defects shown in FIG. 2 are substantially at the same positions in the image (a) and the image (b) of FIG. 2. On the other hand, positions of the threading defects shown in FIG. 3 are largely deviated from each other in the image (a) and the image (b) of FIG. 3. In this respect, the threading defect shown in FIG. 3 is different from the threading defect shown in FIG. 2. This difference related to the positional deviation is caused by an offset angle of a seed crystal, and a cutting angle for making a SiC ingot grown from the seed crystal into SiC substrates. The cause of the difference between the positional deviation of the threading defects shown in FIG. 2 and the positional deviation of the threading defects shown in FIG. 3 will be described below.

Figure 8:
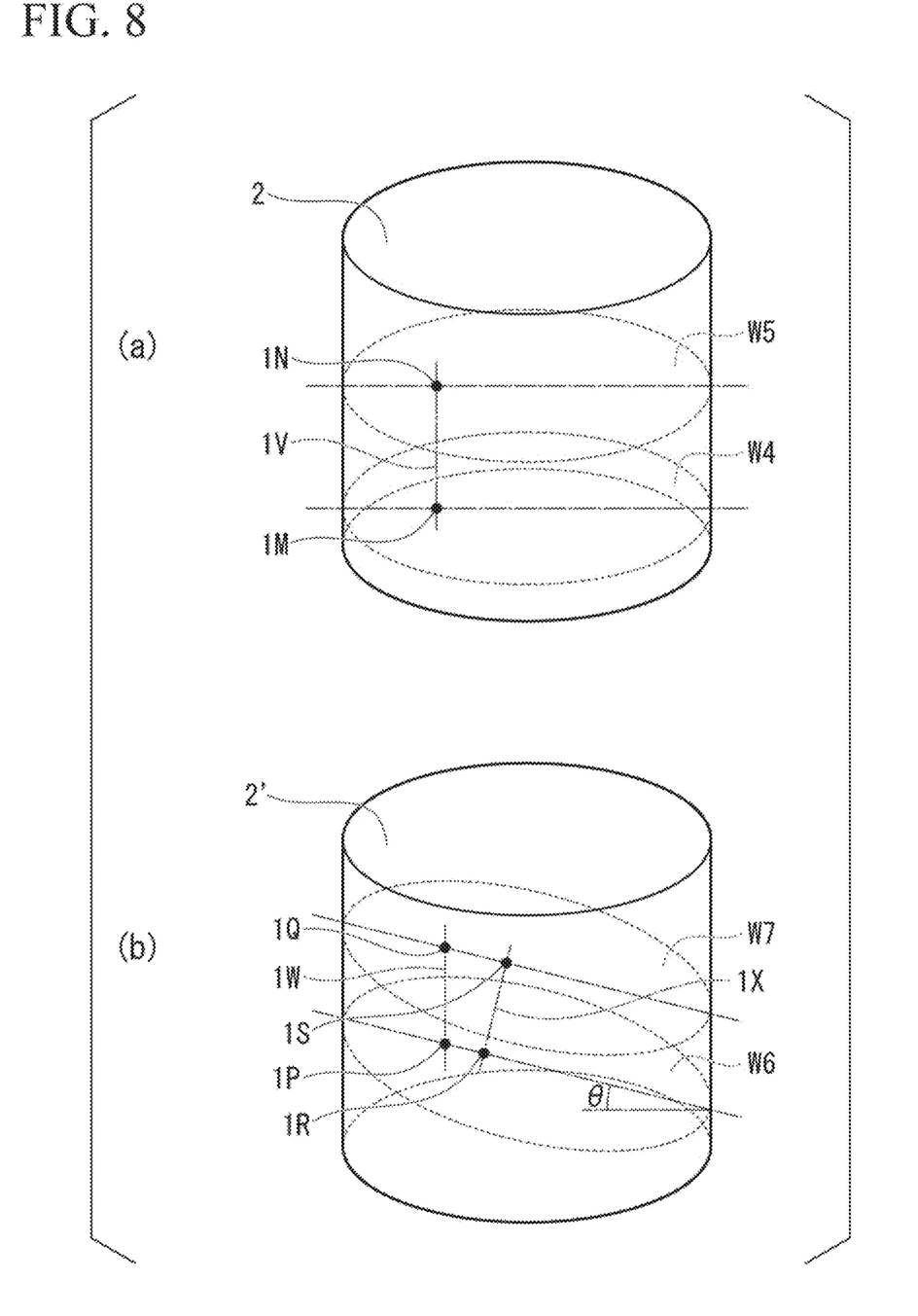
FIG. 8 illustrates schematic views of SiC ingots described in the present embodiment.

Among seed crystals, there are a seed crystal made of a SiC single crystal having no offset angle and a seed crystal made of a SiC single crystal having an offset angle. (a) of FIG. 8 is a schematic view illustrating an example of a SiC ingot 2 grown from a SiC single crystal having an offset angle θ. (b) of FIG. 8 is a schematic view illustrating an example of a SiC ingot 2' grown from a SiC single crystal having no offset angle θ.

When the ingot is formed using the SiC single crystal having the offset angle θ, a threading defect 1V present in the SiC ingot 2 extends parallel to a growth direction of the SiC ingot 2. The SiC ingot 2 is cut perpendicularly to the growth direction of the SiC ingot 2. That is, the threading defect 1V is present across SiC substrates W4 and W5. Position coordinates of the defects 1M and 1N associated with the same threading defect do not change as much even when a branch number of a SiC substrate is changed, that is, even when a position of a SiC substrate in the SiC ingot is changed.

On the other hand, when the ingot is formed using the SiC single crystal having no offset angle θ, a threading defect present in the SiC ingot 2' includes a threading defect 1W which extends in a growth direction of the SiC ingot 2' and a threading defect 1X which extends to be inclined at the angle θ with respect to the growth direction of the SiC ingot 2'. At the time of obtaining SiC substrates, the SiC ingot 2' is cut at an angle inclined by θ with respect to the growth direction of the SiC ingot 2'. Therefore, defects that are inclined with respect to the growth direction of the SiC ingot 2' and defects that are not inclined are present in the threading defects present in the SiC ingot 2'. Specifically, when the ingot 2' is cut at the above-described angle, defect position coordinates of the threading defect 1W extending in the growth direction of the SiC ingot 2' change according to change in a branch number of the substrate such as SiC substrates W6 and W7. On the other hand, in the threading defect IX inclined at an angle by θ with respect to the growth direction of the SiC ingot 2', since the above-described ingot is cut in a direction substantially perpendicular to a direction in which the threading defect 1X extends, defect position coordinates of the threading defect 1X do not change as much even when a branch number is changed. Therefore, in the graph of (a) of FIG. 7, most of the threading defects having the standard deviations of 0.2 or more and less than 0.6 are estimated to be threading defects in which cutting directions of the SiC ingot and growth directions of the threading defects are not perpendicular (for example, the threading defect 1W illustrated in (b) of FIG. 8).

The threading defect in FIG. 2 shows defects present in the SiC substrates obtained by cutting the SiC ingot, which is grown from the seed crystal having an offset angle, in a direction perpendicular to a direction in which the threading defect extends. On the other hand, the threading defect in FIG. 3 shows defects present in the SiC substrates obtained by obliquely cutting the SiC ingot grown from the seed crystal having no offset angle. The present embodiment can be applied to either of the SiC ingots. Further, an alignment accuracy of ±500 μm or less is assumed in the method of evaluating a SiC substrate according to the present embodiment. When the alignment accuracy does not fall within the range of ±500 μm or less, a critical value of the defect distance regarding whether or not the defects are associated with the same threading defect in the comparison step, and a critical value of the defect distance regarding whether or not to perform the correlation determination step can be appropriately adjusted and performed.

<Method of Manufacturing SiC Epitaxial Wafer>

A method of manufacturing a SiC epitaxial wafer according to the present embodiment includes a step of specifying a position of a threading defect using the method of evaluating a SiC substrate according to the above-described embodiment, and the SiC epitaxial wafer can be manufactured by a known method. According to the method of manufacturing a SiC epitaxial wafer according to the present embodiment, it is possible to provide a SiC epitaxial wafer in which a position of a threading defect is ascertained.

<Method of Manufacturing SiC Device>

A method of manufacturing a SiC device according to the present embodiment has a step of specifying a position of a threading defect using the method of evaluating a SiC substrate according to the above-described embodiment, and the SiC device can be manufactured by a known method. While a wafer in which a threading defect is estimated to be positioned by the method of evaluating a SiC substrate is diced into chips, a portion having a problem defect can be screened in advance before manufacturing the SiC device. According to the method of manufacturing a SiC device according to the present embodiment, a chip that may have a defective characteristic when it is used in a device can be identified by screening in advance, and thereby the throughput can be improved.

While preferred embodiments of the present invention have been described above, the present invention is not limited to such specific embodiments, and various modifications and changes can be made within the gist of the present invention described in the claims.

EXPLANATION OF REFERENCES

1 Defect
2 SiC ingot
10 Orientation flat
W SiC substrate

What is claimed is:

1. A method of evaluating a SiC substrate which is used for forming a SiC epitaxial layer thereon, comprising:
a preparation step of preparing two or more SiC substrates before a SiC epitaxial layer is formed, wherein the SiC substrates are used for forming a SiC epitaxial layer and are obtained from the same SiC ingot grown from the same seed crystal,
a defect position specifying step of specifying positions of defects in the substrates by observing a main surface of each of the two or more SiC substrates before a SiC epitaxial layer is formed, with a confocal differential interference microscope or an optical surface inspection device, and
a comparison step of comparing the positions of the defects of the two or more SiC substrates, wherein,
in the preparation step, a SiC substrate positioned closest to the seed crystal is used as a reference wafer among the two or more SiC substrates, and
the comparison step comprises a sub-step wherein
a first defect of the reference wafer is compared with a second defect of a SiC substrate other than the reference wafer,
it is judged whether a defect distance of the two compared defects in a [11-20] direction is 0.6 mm or more or less than 0.2 mm, and
the two compared defects are determined to be defects not associated with the same threading defect when the defect distance is 0.6 mm or more, and
the two compared defects are determined to be defects associated with the same threading defect when the defect distance is less than 0.2 mm.

2. The method of evaluating a SiC substrate according to claim 1, wherein a defect distance between the first defect and the second defect in a [1-100] direction, which are compared in the sub step, is 0.2 mm or less.

3. The method of evaluating a SiC substrate according to claim 1, wherein the comparison step further comprises a sub-step wherein
it is judged whether a defect distance of the first defect and the second defect in a [1-100] direction is 0.2 mm or less, and
the first defect and the second defect are determined to be defects associated with the same threading defect when the defect distance of the first defect and the second defect in a [1-100] direction is 0.2 mm or less.

4. The method of evaluating a SiC substrate according to claim 1, further comprising a correlation determination step, wherein
three or more SiC substrates are prepared from the same SiC ingot in the preparation step, and
when the defect distance of the two defects in the [11-20] direction obtained by comparison in the comparison step is 0.2 mm or more and less than 0.6 mm, the correlation determination step includes:
a sub-step of obtaining a determination coefficient from a position of the first defect, a position of the second defect, a position of a third defect which is present in a SiC substrate different from any of the SiC substrates in which the first defect and the second defect are present and whose defect distances from itself to the first defect and the second defect in the [11-20] direction are each less than 0.6 mm, and a branch number indicating an order of each SiC substrate of the substrates; and
a sub-step of determining a correlation of the defects in which the first defect, the second defect, and the third defect are judged to be defects associated with the same threading defect when the determination coefficient is 0.7 or more.

5. The method of evaluating a SiC substrate according to claim 4, wherein the determination coefficient is 0.5 or more.

6. The method of evaluating a SiC substrate according to claim 1, further comprising an identification step of identifying that the defect that has been judged to be associated with the same threading defect in the comparison step is also present at the same position of all the SiC substrates formed from the same SiC ingot.

7. The method of evaluating a SiC substrate according to claim 1, wherein the reference wafer is a SiC substrate taken out from a range within ¼ of a thickness of the SiC ingot from a surface of the SiC ingot.

8. The method of evaluating a SiC substrate according to claim 1, wherein a position of a threading defect present in a SiC substrate other than the SiC substrates in which the first defect and the second defect are present and obtained from the same SiC ingot is estimated on the basis of the position of the defect that has been judged to be a defect associated with the same threading defect in the comparison step.

9. The method of evaluating a SiC substrate according to claim 1, wherein the reference wafer is a SiC substrate positioned closest to the seed crystal among SiC substrates obtained from the same SiC ingot.

10. A method of manufacturing a SiC epitaxial wafer comprising a recognition step of recognizing a position of a threading defect using the method of evaluating a SiC substrate according to claim 1.

11. A method of manufacturing a SiC device comprising a recognition step of recognizing a position of a threading defect using the method of evaluating a SiC substrate according to claim 1.

12. The method of evaluating a SiC substrate according to claim 4, wherein the determination coefficient is obtained by expression 1 below;

$$R^2 = \frac{\left\{\sum_{i=1}^{N}(n_i - n_a)(x_i - x_a)\right\}^2}{\left\{\sum_{i=1}^{N}(n_i - n_a)^2\right\} \times \left\{\sum_{i=1}^{N}(x_i - x_a)^2\right\}}$$ [Expression 1]

($R^2$ represents determination coefficient,
N represents number of substrates used in the correlation determination step,
n represents branch number of substrates,
x represents X direction component of a defect,
i represents an order of the substrates from a seed crystal side,
$n_i$ represents a branch number of i-th SiC substrate from the seed crystal side,
$n_a$ represents an arithmetic mean of the branch numbers,
$x_i$ represents an X direction component of a defect that determines a correlation,
$x_a$ represents an arithmetic mean of the X direction components).

13. The method of evaluating a SiC substrate according to claim 1, further comprising
a step of manufacturing a SiC epitaxial wafer wherein a SiC epitaxial layer is formed on the SiC substrates, wherein
the step of manufacturing a SiC epitaxial wafer is performed after the comparison step.

14. The method of evaluating a SiC substrate according to claim 1, wherein
the SiC substrates means wafers before a SiC epitaxial layer has been formed thereon, and
SiC epitaxial wafers means wafers after a SiC epitaxial layer has been formed thereon.

15. The method of manufacturing a SiC epitaxial wafer according to claim 10, further comprising
a step of manufacturing a SiC epitaxial wafer wheerein a SiC epitaxial layer is formed on the SiC substrates, wherein
the step of manufacturign a SiC epitaxial wafer is performed after the recognition step.

16. The method of evaluating a SiC substrate according to claim 1, wherein
in a case wherein the SiC substrates do not have an offset angle, the defect distance between the two compared defects in the SiC substrates in a [11-20] direction is obtained by
providing orthogonal coordinates respectively on surfaces of the SiC substrates, wherein the centers of the substrates are provided as centers of the coordinates, the [11-20] direction represents an X-axis direction of the coordinates and a [1-100] direction represents a Y-axis direction of the coordinates, and
obtaining an absolute value of a differents (X−x), as the defect distance, wherein the absolute value is obtained by subtraction using a position coordinate (X, Y) of the first defect in the reference wafer and a position coordinate (x, y) of the second defect of the SiC substrate other than the reference wafer.

17. The method of evaluating a SiC substrate according to claim 1, wherein
in a case where the SiC substrates have an offset angle with respect to a [11-20] direction, the defect distance between the two compared defects is obtained based on an orthogonal projection from position coordinates of orthogonal coordinates, which are provided respectively on a main surface of the SiC substrates where defects are respectively observed.

18. The method of evaluating a SiC substrate according to claim 1, wherein the preparation step is performed by slicing the SiC ingot to prepare the two or more SiC substrates.

\* \* \* \* \*